(12) United States Patent
Ye

(10) Patent No.: US 11,550,414 B2
(45) Date of Patent: Jan. 10, 2023

(54) TOUCH DISPLAY SCREEN AND TOUCH DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jian Ye, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/278,273

(22) PCT Filed: Dec. 31, 2020

(86) PCT No.: PCT/CN2020/142410
§ 371 (c)(1),
(2) Date: Mar. 19, 2021

(87) PCT Pub. No.: WO2022/141518
PCT Pub. Date: Jul. 7, 2022

(65) Prior Publication Data
US 2022/0206606 A1    Jun. 30, 2022

(51) Int. Cl.
*G06F 3/041*    (2006.01)
(52) U.S. Cl.
CPC .. *G06F 3/0412* (2013.01); *G06F 2203/04102* (2013.01); *G06F 2203/04107* (2013.01)

(58) Field of Classification Search
None
See application file for complete search history.

(56) References Cited

U.S. PATENT DOCUMENTS

| 2012/0190220 A1 | 7/2012 | Lee et al. |
| 2018/0374804 A1 | 12/2018 | Zhang et al. |

(Continued)

FOREIGN PATENT DOCUMENTS

| CN | 106125992 A | 11/2016 |
| CN | 206379353 U | 8/2017 |

(Continued)

OTHER PUBLICATIONS

International Search Report in International application No. PCT/CN2020/142410 dated Sep. 22, 2021.

(Continued)

*Primary Examiner* — Brian M Butcher
(74) *Attorney, Agent, or Firm* — PV IP PC; Wei Te Chung; Ude Lu

(57) ABSTRACT

The present application provides a touch display screen and a touch display device. The touch display screen includes a touch panel and a display panel. The touch panel is provided with at least one touch line, and the display panel is provided with at least one data signal line. The touch line and data signal line extend from a display area of the touch display screen to a fan-out area. A shielding layer is arranged between the touch line and the data signal line in the fan-out area to solve a problem that the data signal line interferes with touch signals of the touch line.

18 Claims, 4 Drawing Sheets

(56) References Cited

U.S. PATENT DOCUMENTS

2019/0079623 A1* 3/2019 Kim .................. G06F 3/0443
2020/0176540 A1* 6/2020 Park .................. G09G 3/3225

FOREIGN PATENT DOCUMENTS

| CN | 109559644 A | 4/2019 |
| CN | 110244873 A | 9/2019 |
| CN | 110262695 A | 9/2019 |
| CN | 111610884 A | 9/2020 |
| CN | 112114707 A | 12/2020 |

OTHER PUBLICATIONS

Chinese Office Action issued in corresponding Chinese Patent Application No. 202011608001.6 dated Apr. 14, 2022, pp. 1-7.

* cited by examiner

TOUCH DISPLAY SCREEN AND TOUCH DISPLAY DEVICE

RELATED APPLICATIONS

This application is a National Phase of PCT Patent Application No. PCT/CN2020/142410 having international filing date of Dec. 31, 2020, which claims the benefit of priority of Chinese Patent Application Nos. 202011608001.6 filed on Dec. 30, 2020. The contents of the above applications are all incorporated by reference as if fully set forth herein in their entirety.

FIELD OF DISCLOSURE

The present application relates to a field of display technology and in particular, to a touch display screen and a touch display device.

DESCRIPTION OF RELATED ART

Flexible organic light emitting diode (OLED) displays are more and more popular in the market due to the advantages of active light emission, large viewing angles, wide color gamut, high brightness, fast response speed, low power consumption, and structural flexibility. The On-Cell touch solution of the flexible active matrix organic light emitting diode (AMOLED) displays requires setting a touch panel on the OLED panel. The touch panel can adopt a self-capacitance structure, that is, a self-capacitance direct On-Cell touch (S-DOT) solution. The self-capacitance structure includes a plurality of independent touch sub-electrodes, and each independent touch sub-electrode is separately extended out through a touch line, which can effectively improve performance such as touch sensitivity. Moreover, based on the S-DOT solution, TDDI (Touch Display Driver Integrated) technology can also be implemented. The TDDI technology refers to integrating a touch integrated circuit (IC) and a display driver IC into one IC, which can reduce the costs of IC.

The self-capacitance structure of the flexible AMOLED On-Cell touch display screen with the TDDI technology based on the S-DOT solution includes hundreds or even thousands of touch sub-electrodes, and each touch sub-electrode is separately connected (extended) to TDDI through a corresponding touch line. Therefore, at a line outgoing position in a fan-out (fanout) area of a down border, there is an overlap between many touch lines in an upper layer and many display signal lines (including data lines, gate lines, and etc.) in a lower layer. Since a touch panel and an OLED display panel are driven at the same time, the display signal lines located below the touch lines and located at adjacent positions greatly interfere with touch signals in the upper layer, which affects the accuracy of touch control and even causes failures of the touch function.

Therefore, there is a need to solve the problem with conventional S-DOT display screens, that is, the display signal lines interfere with the touch signals in the upper layer.

SUMMARY

The present application provides a touch display screen and a touch display device to alleviate a technical problem with conventional self-capacitance direct On-Cell touch (S-DOT) display screens that a display signal line interferes with touch signals in an upper layer.

Accordingly, the present application provides the following solution.

The present application provides a touch display screen, comprising a display area and a fan-out area, wherein the fan-out area is arranged at one side of the display area; the fan-out area comprises a bending area, a bonding area, a first area between the bending area and the display area, and a second area between the bending area and the bonding area; and the touch display screen comprises:

a display panel in which a plurality of data signal lines are arranged; and a touch panel in which a plurality of touch lines are arranged;

wherein the plurality of touch lines and the plurality of data signal lines extend from the display area to the fan-out area; in the first area and the second area, the plurality of touch lines are arranged corresponding to the plurality of data signal lines which are disposed in a different layer from the plurality of touch lines; and a first shielding layer is arranged between the touch line and the data signal line.

According to one embodiment of the touch display screen, in the bending area and the bonding area, the plurality of touch lines are spaced apart from the plurality of data signal lines in a same layer, and a second shielding layer is disposed between the touch line and the data signal line.

In the touch display screen according to one embodiment, the plurality of touch lines are grouped into a plurality of touch line groups, the plurality of data signal lines are grouped into a plurality of data signal line groups, and the plurality of touch line groups and the plurality of data signal line groups are arranged corresponding to each other in different layers or arranged spaced apart from each other in a same layer.

In the touch display screen according to one embodiment, a power line is disposed in the display panel, and the first shielding layer comprises the power line.

In the touch display screen according to one embodiment, the power line is provided with a first gap corresponding to the bending area, a width of the first gap is greater than a width of the bending area, and the plurality of touch lines and the plurality of data signal lines are routed at the first gap to a layer the same as the power line.

In the touch display screen according to one embodiment, the power line is provided with a second gap corresponding to the bonding area, the second gap extends beyond the bonding area and extends to the second area, and the plurality of touch lines and the plurality of data signal lines are routed at the second gap to the layer the same as the power line.

In the touch display screen according to one embodiment, the second shielding layer comprises the power line.

In the touch display screen according to one embodiment, a plurality of isolation lines are arranged in the bending area and the bonding area, and the plurality of isolation lines are arranged in at least one area between any two of the power line, the touch line, and the data signal line.

In the touch display screen according to one embodiment, the second shielding layer comprises the power line and the plurality of isolation lines.

In the touch display screen according to one embodiment, the power line is disconnected at a disconnection position close to the bonding area, and the touch line and the data signal line are routed at the disconnection position to the layer the same as the power line and extend to the bonding area, and the touch line and the data signal line are spaced apart in the bonding area.

In the touch display screen according to one embodiment, the bonding area is further provided with a plurality of isolation lines, and the plurality of isolation lines are arranged between the plurality of touch lines and the plurality of data signal lines.

In the touch display screen according to one embodiment, the second shielding layer of the bonding area comprises the plurality of isolation lines.

In the touch display screen according to one embodiment, a driver chip is bonded to the bonding area, and the plurality of touch lines and the plurality of data signal lines are connected to the driver chip.

The present application provides a touch display device, comprising a touch display screen, the touch display screen comprising a display area and a fan-out area, wherein the fan-out area is arranged at one side of the display area; the fan-out area comprises a bending area and a bonding area, a first area between the bending area and the display area, and a second area between the bending area and the bonding area; and the touch display screen comprises:

a display panel in which a plurality of data signal lines are disposed; and a touch panel in which a plurality of touch lines are arranged;

wherein the plurality of touch lines and the plurality of data signal lines extend from the display area to the fan-out area; and in the first area and the second area, the plurality of touch lines are arranged corresponding to the plurality of data signal lines in a different layer from the plurality of touch lines, and a first shielding layer is arranged between the touch line and the data signal line.

According to one embodiment of the touch display device, in the bending area and the bonding area, the plurality of touch lines are spaced apart from the plurality of data signal lines in a same layer, and a second shielding layer is disposed between the touch line and the data signal line.

In the touch display device according to one embodiment, wherein the plurality of touch lines are grouped into a plurality of touch line groups, the plurality of data signal lines are grouped into a plurality of data signal line groups, and the plurality of touch line groups and the plurality of data signal line groups are arranged corresponding to each other in different layers or arranged spaced apart from each other in a same layer.

In the touch display screen according to one embodiment, a power line is disposed in the display panel, and the first shielding layer comprises the power line.

In the touch display device according to one embodiment, the power line is provided with a first gap corresponding to the bending area, a width of the first gap is greater than a width of the bending area, and the plurality of touch lines and the plurality of data signal lines are routed at the first gap to a layer the same as the power line.

In the touch display device according to one embodiment, the second shielding layer comprises the power line.

In the touch display screen according to one embodiment, a plurality of isolation lines are arranged in the bending area, and the plurality of isolation lines are arranged in at least one area between any two of the power line, the touch line, and the data signal line.

The touch display screen and the touch display device of the present application are provided with the shielding layer between the touch line and the data signal line in the fan-out area. In areas where the touch line and the data signal line are arranged corresponding to each other in different layers, the shielding layer is formed by the power line. The power line outputs a constant DC voltage signal and can effectively avoid the interference of the data signal line to the touch line in an upper layer. In areas where the touch line and the data signal line are spaced from each other in the same layer, the shielding layer is formed by a power line or an additional isolation line. The isolation line is a separate dummy line with no electric signals, which prevents the touch line from being interfered by the data signal line from a lateral side. By providing the shielding layer, the present application solves a problem that the data signal line interferes with touch signals of the touch line, thereby improving the touch performance.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
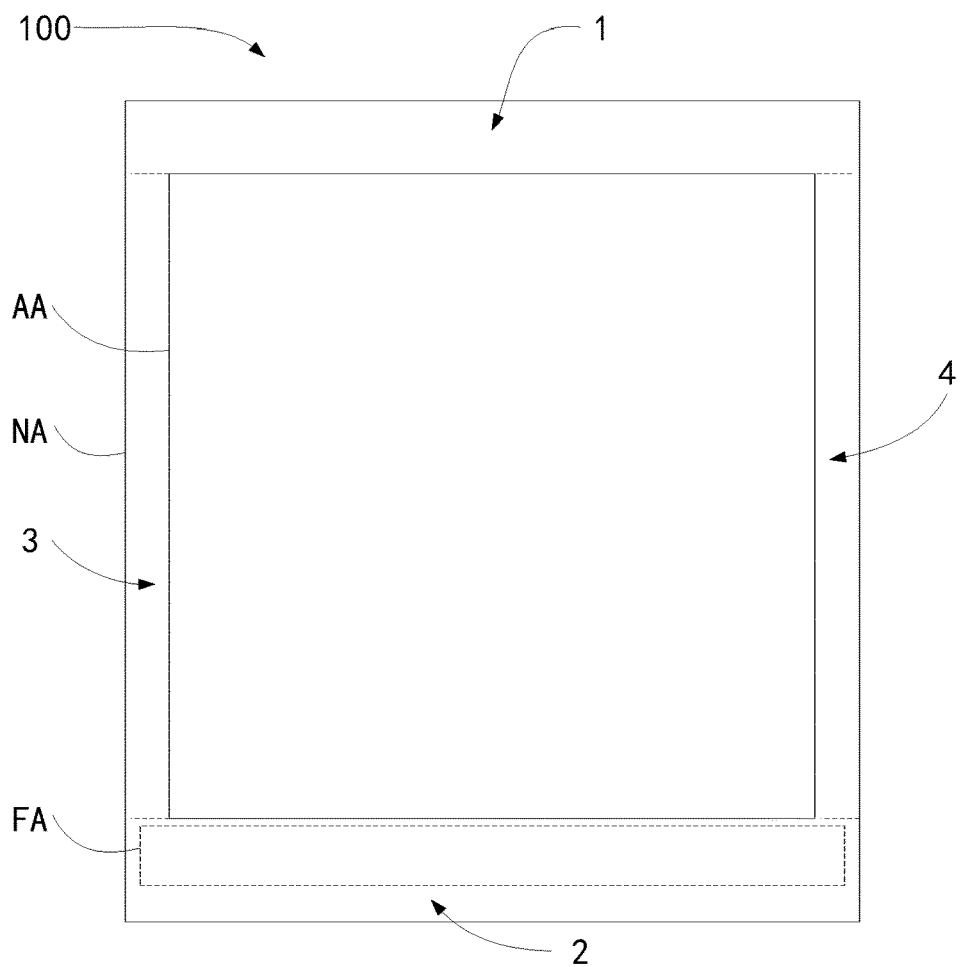
FIG. 1 is a schematic top view illustrating a touch display screen according to one embodiment of the present application.

The following description with reference to the accompanying drawings is provided to illustrate specific embodiments of the present application. The directional terms mentioned in the present application, such as "top", "bottom", "front", "rear", "left", "right", "inner", "outer", and "lateral", are for illustrative purposes. The direction terms are provided for ease of understanding the present application and not intended to limit the present application. In the drawings, structurally similar units are denoted by the same reference numerals. In the drawings, thicknesses of some layers and regions are exaggerated for clear understanding and ease of description. That is, a size and a thickness of each component shown in the drawings are schematically shown, and the present application is not limited thereto.

Figure 2:
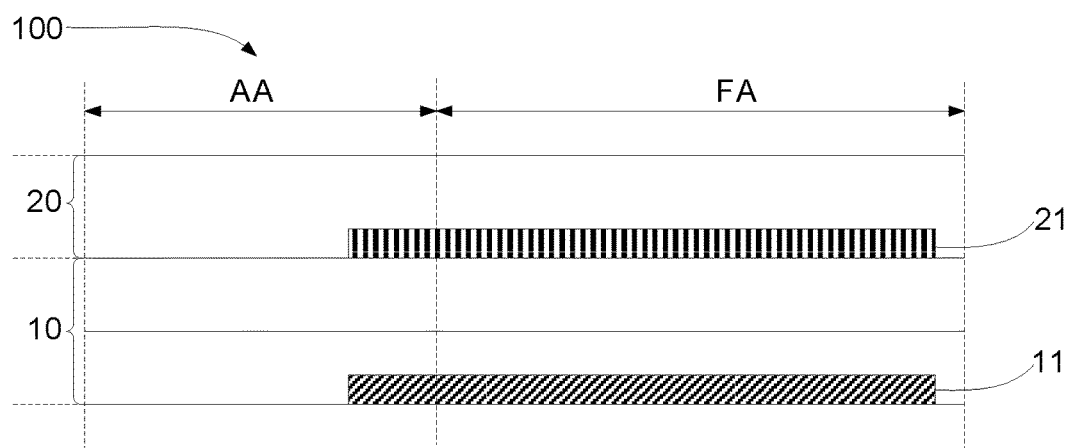
FIG. 2 is a schematic cross-sectional view illustrating a touch display screen according to one embodiment of the present application.

Please refer to FIGS. 1 and 2. FIG. 1 is a schematic top view illustrating a touch display screen according to one embodiment of the present application, and FIG. 2 is a schematic cross-sectional view illustrating the touch display screen according to one embodiment of the present application. The touch display screen 100 is divided into a display area AA and a non-display area NA. The non-display area NA surrounds the display area AA, and the non-display area NA comprises a plurality of borders, like an upper border 1, a lower border 2, a left border 3, and a right border 4, as shown schematically in FIG. 1. The lower border 2 is provided with a fan-out area (fanout area) FA, the fan-out area FA is located at one side of the display area AA, and is used to fan out various wires/lines in the touch display screen 100. The touch display screen 100 comprises a display panel 10 and a touch panel 20. At least one data signal line 11 is disposed in the display panel 10, and the data signal line 11 comprises a source driving signal line (i.e., a data line) or a gate line. At least one touch line 21 is disposed in the touch panel 20. Wherein, the touch line 21 and the data signal line 11 extend from the display area AA to the fan-out area FA.

The fan-out area FA is described in detail below.

Figure 3:
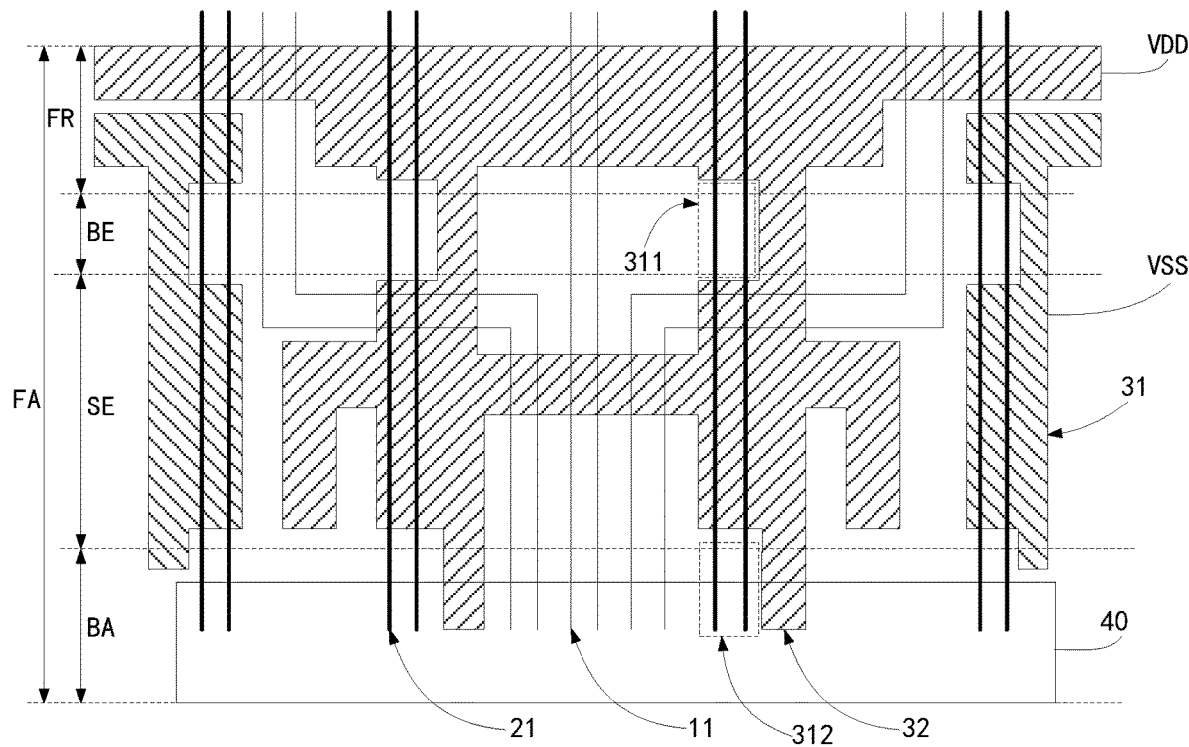
FIG. 3 is a first schematic top view illustrating a fan-out area according to one embodiment of the present application.

Please refer to FIG. 3, which is a schematic top view illustrating the fan-out area according to one embodiment of the application. The fan-out area FA comprises a bending area BE and a bonding area BA, a first area FR located between the bending area BE and the display area AA, and a second area SE located between the bending area BE and the bonding area BA. The bonding area BA is used to bond a driver chip (an integrated circuit, or IC for short) 40. The driver chip 40 comprises a touch display driver integrated (TDDI) chip. The TDDI chip can provide driving signals to the touch panel 20 and the display panel 10 at the same time. By bending the bending area BE, the bonding area BA in which the driver chip 40 is bonded can be bent to a back of the display panel to realize a narrow bezel design.

In the first area FR and the second area SE, the touch line 21 and the data signal line 11 are arranged corresponding to each other in different layers, and a first shielding layer 31 is arranged between the touch line 21 and the data signal line 11. In the bending area BE and the bonding area BA, the touch line 21 and the data signal line 11 are arranged spaced apart from each other in a same layer, and a second shielding layer 32 is arranged between the touch line 21 and the data signal line 11. In the bonding area BA, the touch line 21 and the data signal line 11 are connected to the driver chip 40. Certainly, a plurality of pins are arranged on the driver chip 40, and the touch lines 21 and the data signal lines 11 are respectively connected to the corresponding pins on the driver chip 40. A spacing between two adjacent pins is the same, for example, it can be 28 microns, but the present application is not limited in this regard.

Specifically, the display panel 10 is provided with a power line. The power line comprises a VDD signal line and a VSS signal line. Both the VDD signal line and the VSS signal line provide a constant direct current (DC) voltage signal to the display panel 10. The VDD signal line provides a constant DC high potential voltage signal, and the VSS signal line provides a constant DC low potential voltage signal. In the first area FR and the second area SE, the first shielding layer 31 comprises the power line. That is, in the first area FR and the second area SE, the power line is arranged in a different layer from the data signal line 11 and the touch line 21, and the power line is located between the data signal line 11 and the touch line 21. The power line also serves as the first shielding layer 31, and the first shielding layer 31 can effectively prevent the data signal line 11 from interfering with touch signals of the touch line 21.

Figure 4:
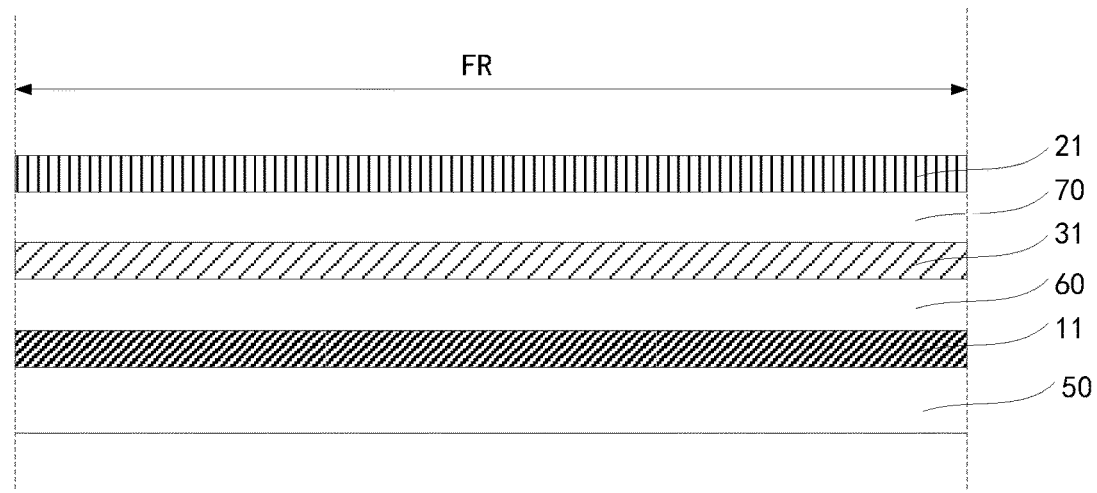
FIG. 4 is a schematic cross-sectional view illustrating a film structure of a first area of the fan-out area according to one embodiment of the present application.

Specifically, a description is made by taking the first area FR as an example. Please refer to FIGS. 3 and 4 together. FIG. 4 is a schematic cross-sectional view illustrating a film structure of the first area of the fan-out area according to one embodiment of the present application. In FIG. 4, the data signal line 11 is arranged on a substrate 50, the first shielding layer 31 (i.e., the power line) is arranged over the data signal line 11, and the touch line 21 is arranged over the first shielding layer 31, wherein a first insulating layer 60 is arranged between the data signal line 11 and the shielding layer 31, and a second insulating layer 70 is arranged between the touch line 21 and the shielding layer 31.

Referring to FIG. 3, in the first area FR, the touch lines 21 are arranged over a portion of the VDD signal lines or the VSS signal lines. Because line widths of the VDD signal lines and the VSS signal lines are relatively wider compared to line widths of the touch lines 21 and data signal lines 11, a plurality of the touch lines 21 can be arranged over each of the VDD signal lines and the VSS signal lines. As shown schematically in FIG. 3, two touch lines 21 are provided above each of the VDD signal lines and the VSS signal lines; certainly, the present application is not limited in this regard. A plurality of the touch lines 21 arranged over each of the VDD signal lines and the VSS signal lines are a touch line group, and a width of the touch line group is less than the width of each VDD signal line or each VSS signal line. The data signal lines 11 are also grouped into a plurality of data signal line groups. Each data signal line group also comprises a plurality of the data signal lines 11, and the data signal line groups are arranged in a one-to-one correspondence with the touch line groups arranged over the data signal line groups. It should be noted that there are far more data signal lines 11 than the touch lines 21, so a number of the data signal lines 11 in each data signal line group is greater than a number of the touch lines 21 in each touch line group, and a width of each data signal line group is greater than the width of the VDD signal line or the VSS signal line. In FIG. 3, one data signal line group is arranged below each touch line group. Because the VDD signal line and the VSS signal line are arranged between the touch line group and the data signal line group. The VDD signal lines and the VSS signal lines are wider than the touch lines 21 and the data signal lines 11, so in the top view, the data signal line groups disposed corresponding to the touch line groups are shielded by the VDD signal lines and VSS signal lines. Therefore, FIG. 3 shows only a portion of the data signal line 11, which is not shielded by the VDD signal lines and the VSS signal lines, and FIG. 3 does not show the data signal line 11 that is arranged corresponding to the touch line 21 and is shielded by the VDD signal line and the VSS signal line.

It should be noted that, in the second area SE, a positional relationship between the touch line 21, the data signal line 11, and the first shielding layer 31 (i.e., the power line) is the same as a positional relationship between them in the first area FR, so a detailed description is not repeated here.

Referring to FIG. 3, in the bending area BE and the bonding area BA, the touch line 21 and the data signal line 11 are spaced apart in a same layer. The power line is located between the touch line 21 and the data signal line 11, and they are spaced apart from each other. It should be noted that, in the bending area BE and the bonding area BA, the touch line group and the data signal line group are spaced apart in the same layer, and the power line is inserted between the touch line group and the data signal line group. This way, the power line also serves as the second shielding layer 32, that is, the second shielding layer 32 comprises the power line, and the second shielding layer 32 can avoid lateral interference of the data signal line 11 to the touch signals of the touch line 21.

Figure 5:
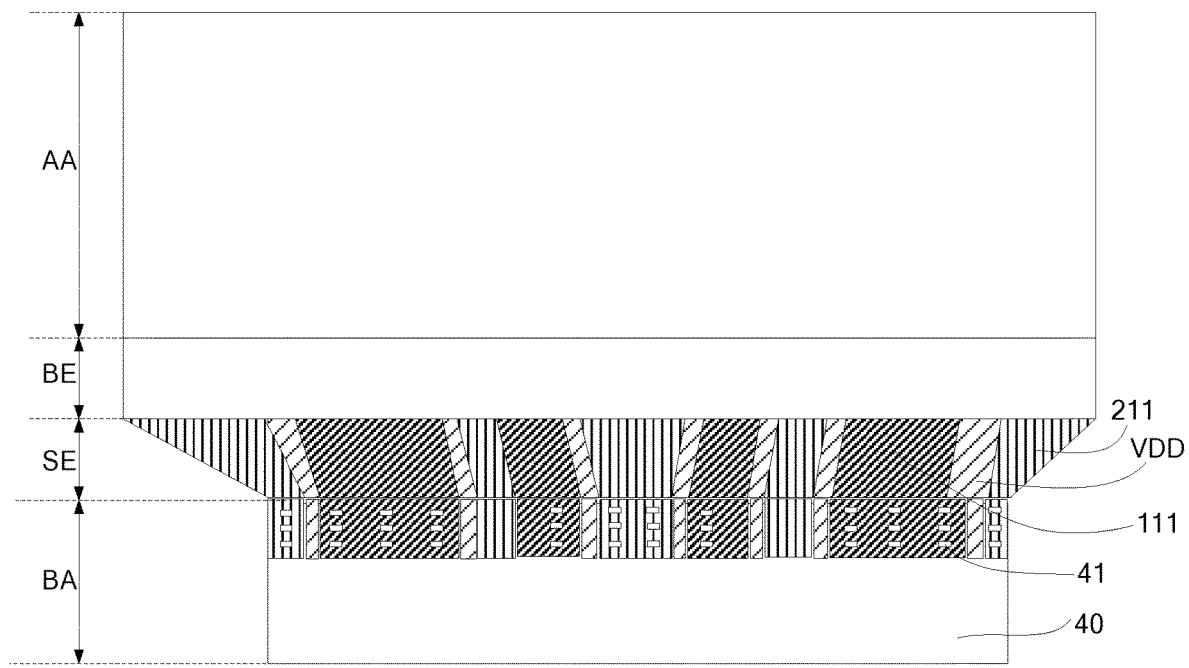
FIG. 5 is a schematic view illustrating a positional relationship between a touch line group and a data signal line group according to one embodiment of the present application.

Specifically, a positional relationship between the touch line group and the data signal line group in the second area and the bonding area is taken as an example for description. Please refer to FIG. 3 and FIG. 5 together. FIG. 5 is a schematic view illustrating the positional relationship between the touch line group and the data signal line group according to one embodiment of the present application. In the second area SE, the touch line group 211 and the data signal line group 111 are arranged corresponding to each other in different layers. The width of the touch line group 211 is less than the width of the VDD signal line or the width of the VS S signal line (taking the VDD signal line as an example), and the width of the data signal line group 111 is greater than the width of the VDD signal line, so in a top view, the VDD signal line is inserted between the touch line group 211 and the data signal line group 111.

The touch line 21 and the data signal line 11 are routed to the same layer as the VDD signal line at a position close to the bonding area BA. Accordingly, the touch line group 211 and the data signal line group 111 are also routed to the same layer as the VDD signal line. In the bonding area BA, the touch line group 211 and the data signal line group 111 are spaced apart in the same layer, and the VDD signal line is inserted between the touch line group 211 and the data signal line group 111.

At the same time, in the bonding area BA, because the touch lines 21 and the data signal lines 11 are arranged in groups, the pins 41 of the driver chip 40 are also arranged in groups to be correspondingly connected to the touch lines 21 and the data signal lines 11.

It should be noted that, when the touch line groups 211 and the data signal line groups 111 extend from the bending area BE to the bonding area BA, the touch line groups 211 and the data signal line groups 111 extend in a converging manner, and therefore, they form a fan shape in the second region SE as shown in FIG. 5. In addition, the present embodiment only takes, as an example for description, the positional relationship between the touch line groups 211 and the data signal line groups 111 in the second area SE and the bonding area BA, so FIG. 5 does not show details of the display area AA and the bending area BE, and the first area between the display area AA and the bending area BE. In addition, in the drawings, the numbers and the shapes (including line width) of the touch lines, the data signal lines, and the VDD signal lines and the number of pins of the driver chip are only for illustrative purposes, and can be specifically set according to actual needs; the present invention is not limited in this regard.

The following will specifically describe how the touch lines 21 and the data signal lines 11 are routed between the same layer and different layers.

Figure 6:
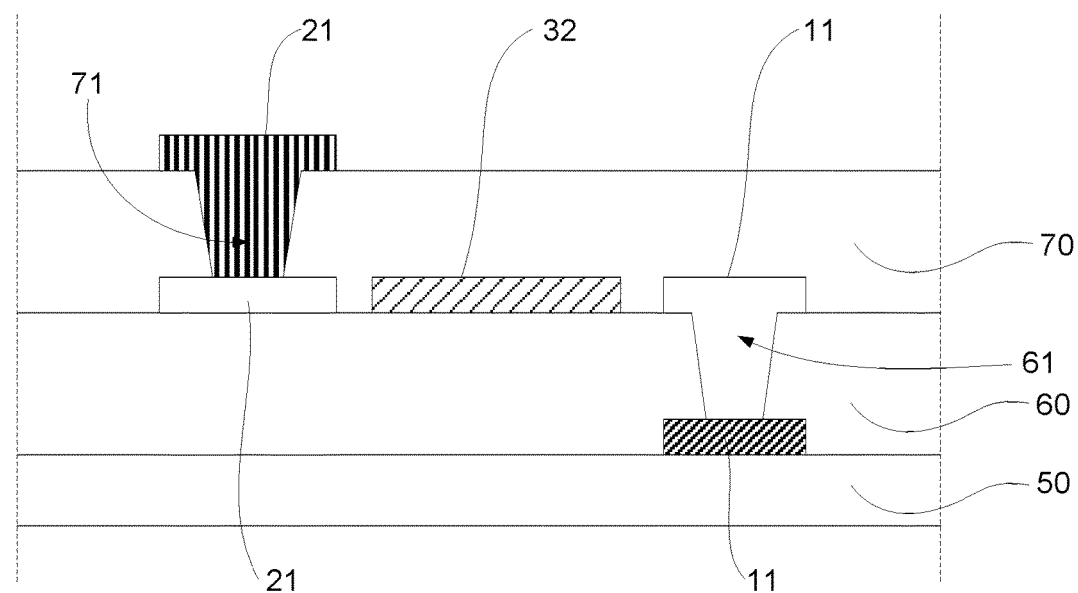
FIG. 6 is a schematic cross-sectional film structural view illustrating routing a signal line according to one embodiment of the present application.

Please refer to FIG. 3 and FIG. 6 together. FIG. 6 is a schematic cross-sectional view film structural view illustrating routing the signal line to the same layer according to one embodiment of the present application. In FIG. 3, the power line is provided with a first gap 311 corresponding to the bending area BE, and a width of the first gap 311 is greater than a width of the bending area BE, that is, the first gap 311 partially extends from the bending area BE to the first area FR and the second area SE, the first gap 311 exceeds the width of the bending area BE, and the touch line 21 and the data signal line 11 are routed at the first gap 311 to the layer the same as the power line.

Specifically, a portion of the first gap 311 which extends to the first area FR is configured to route the touch line 21 and the data signal line 11 in the first area FR from different layers to the layer the same as the power line, so that the touch line 21, the data signal line 11, and the second shielding layer 32 (i.e., the power line) are arranged spaced apart from each other in the same layer in the bending area BE. Specifically, as shown in FIG. 6, the touch line 21 is routed (by line connection) to the same layer as the second shielding layer 32 through a second via hole 71 of the second insulating layer 70. The data signal line 11 is routed to the same layer as the second shielding layer 32 through a first via hole 61 of the first insulating layer 60. The second shielding layer 32 is located between a portion of the touch line 21 and a portion of the data signal line 11. Because the touch line 21, the data signal line 11, and the second shielding layer 32 are all electrical signal lines, the three are separated from each other to prevent short circuit, that is, after this line routing, the touch line 21, the data signal line 11, and the second shielding layer 32 are arranged spaced apart in the bending area BE.

A portion of the first gap 311 which extends to the second area SE is configured to route the touch line 21 and the data signal line 11 in the bending area BE from the same layer to different layers from the power line, so that the touch line 21, the data signal line 11, and the first shielding layer 31 (i.e., the power line) are arranged corresponding to each other in different layers in the second region SE.

It should be noted that a driver circuit layer of the display panel can include metal layers such as a gate layer, a source-drain layer, and an insulating layer disposed between the metal layers. The power line can be arranged in the source-drain layer, the data signal line can be disposed in the gate layer in the first area and the second area, but in the bending area, the data signal line is routed to the source-drain layer to be in the same layer as the power line. The touch line can be arranged in a top metal layer of the touch panel, but in the bending area, the touch line is routed to the source-drain layer to be in the same layer as the power line.

Referring to FIG. 3, the power line is provided with a second gap 312 corresponding to the bonding area BA. The second gap 312 extends beyond the bonding area BA and extends to the second area SE. The touch line 21 and the data signal line 11 are routed at the second gap 312 to the same layer as the power line.

Specifically, a portion of the second gap 312, which extends to a portion of the second area SE is used to route the touch line 21 and the data signal line 11 in the second area SE from different layers to the same layer as the power line, so that the touch line 21, the data signal line 11, and the second shielding layer 32 (i.e., the power line) are spaced apart from each other in the same layer in the bonding area BA. The touch line 21 and the data signal line 11 in the bonding area BA are respectively connected to corresponding pins on the driver chip 40, and the power line in the bonding area BA only serves as the second shielding layer 32 to avoid lateral interference of the data signal line 11 to the touch signals of the touch line 21, so the power line in the bonding area BA is not electrically connected to the driver chip 40.

In the present embodiment, a portion of the power line is also used as the first shielding layer 31 and the second shielding layer 32, and is arranged between the touch line 21 and the data signal line 11. Moreover, because the power line provides constant DC voltage signals, such configuration effectively prevents the data signal line 11 from interfering with the touch signals of the touch line 21.

Figure 7:
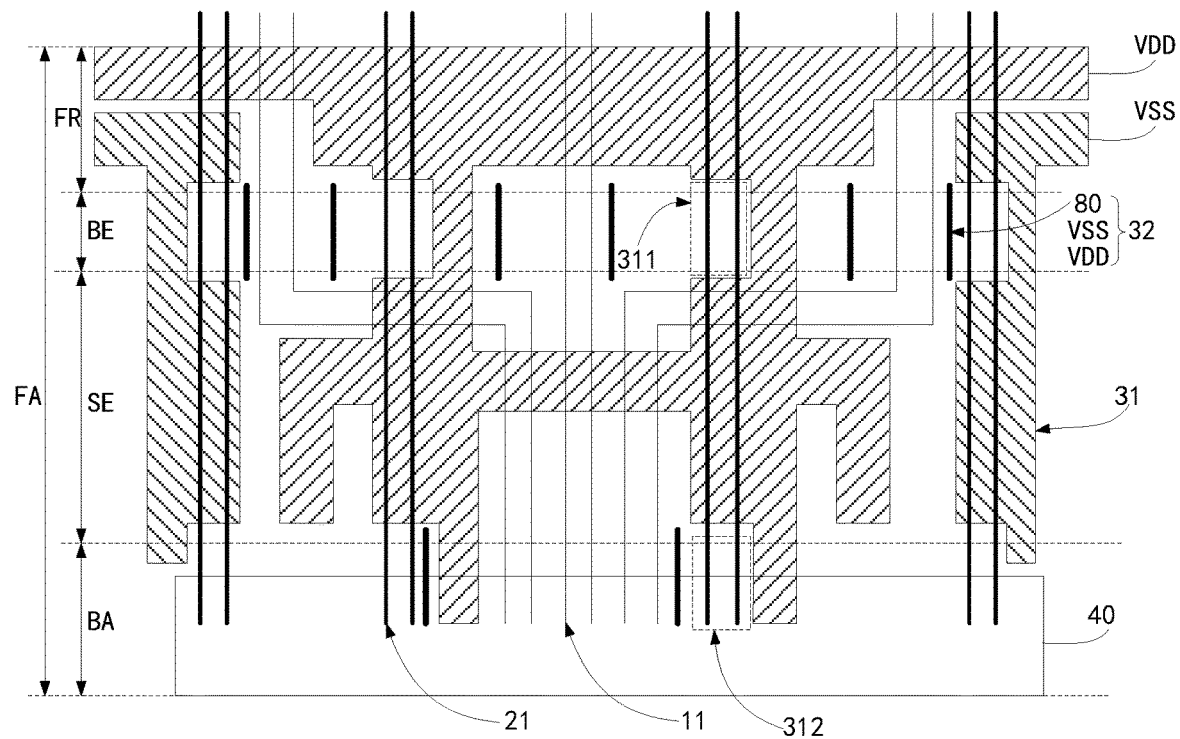
FIG. 7 is a second schematic top view illustrating the fan-out area according to one embodiment of the present application.

In one embodiment, different from the above-mentioned embodiment, the fan-out area FA is further provided with an isolation line 80. Please refer to FIG. 7. FIG. 7 is a second schematic top view illustrating the fan-out area according to one embodiment of the present application. In the bending area BE and the bonding area BA, the touch lines 21 and the data signal lines 11 are routed to the same layer as the power line. As a result, a portion of the touch lines 21 and the data signal lines 11 are not spaced by the power line. In order to better avoid the lateral interference of the data signal line 11 to the touch signals of the touch line 21, the isolation line 80 can be provided between the data signal line 11 and the touch line 21, and the second shielding layer 32 can include the power line and the isolation line 80.

Specifically, continuing to refer to FIG. 7, in the bending area BE and the bonding area BA, the isolation line 80 is disposed between a portion of the touch line 21 and the data signal line 11, and the isolation line 80 can also be arranged between the power line and the touch line 21 or between the power line and the data signal line 11. The isolation line 80 can be a separately provided dummy line or can be other signal line extended from the touch panel 20, such as a guard line of the touch panel 20. Please refer to the above-mentioned embodiment for other details, and a description thereof is not repeated here.

In the present embodiment, the isolation line 80 is arranged in the bending area BE and the bonding area BA, the second shielding layer 32 comprises the isolation line 80 and the power line, so that the present embodiment can better avoid lateral interference of the data signal lines 11 with the touch signals of the touch lines 21.

Figure 8:
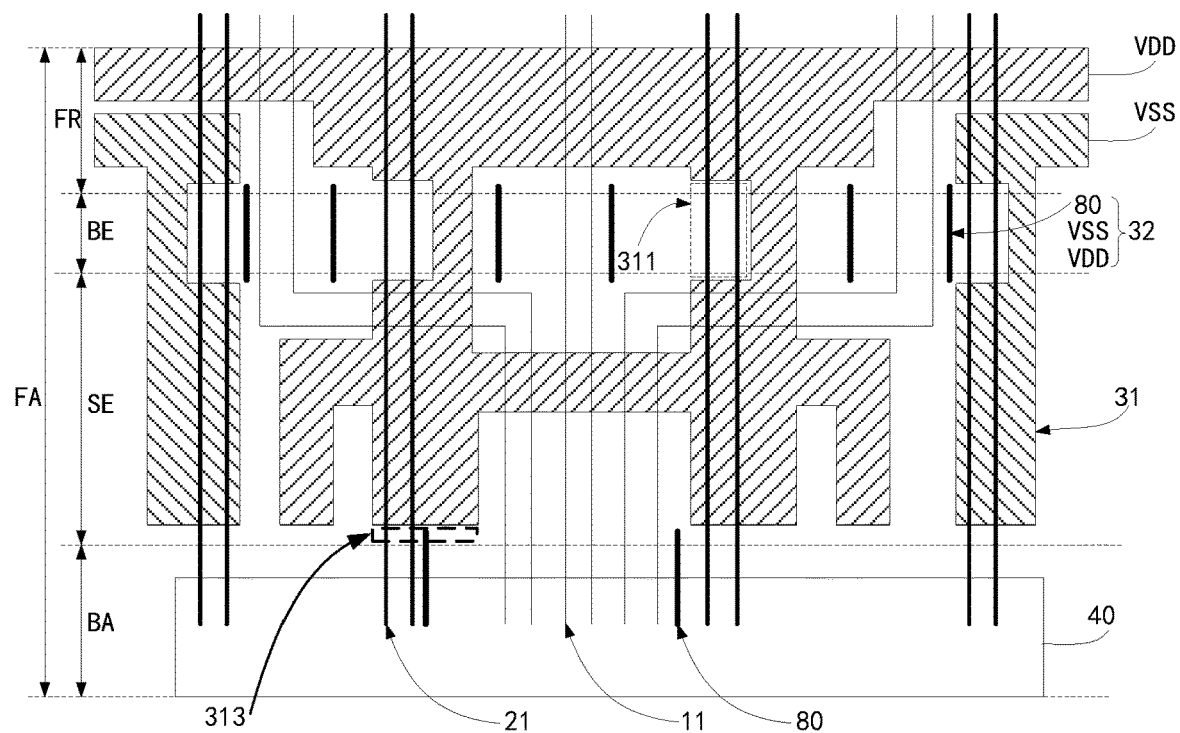
FIG. 8 is a third schematic top view illustrating the fan-out area according to one embodiment of the present application.

In one embodiment, please refer to FIG. 8, which is a third schematic top view illustrating the fan-out area according to one embodiment of the present application. The difference from the foregoing embodiment is that the fan-out area FA of the present embodiment is also provided with the isolation line 80, and a portion of the power line is disconnected near the bonding area BA. In the bonding area BA, the second shielding layer 32 comprises the isolation line 80. To be specific, in the bonding area BA, the second shielding layer 32 only has the isolation line 80, and has no power lines. However, in the bending area BE, the second shielding layer 32 still includes the power line and the isolation line 80. Specifically, referring to FIGS. 6 and 8 together, the power line is disconnected at a position close to the bonding area BA, a disconnection position 313 is shown in FIG. 8. The touch line 21 is routed, at the disconnection position 313 of the power line, to the same layer as the power line through the second via hole 71 of the second insulating layer 70. The data signal line 11 is routed, at the disconnection position 313 of the power line, to the same layer as the power line through the first via hole 61 of the first insulating layer 60. In the bonding area BA, the isolation line 80 separates the touch line 21 from the data signal line 11. There can be one or more isolation lines 80, and the isolation lines 80 are arranged at intervals. Please refer to the above-mentioned embodiment for other details, and a description thereof is not repeated here.

In one embodiment, a touch display device is provided. The touch display device includes the touch display screen 100 of one of the above-mentioned embodiments, and a flexible printed circuit board (flexible printed circuit assembly, i.e., FPCA for short) connected to the touch display screen 100.

According to the above embodiment, it can be known:

The present application provides a touch display screen and a touch display device. The touch display screen is divided into a display area and a fan-out area. The fan-out area is located at one side of the display area. The touch display screen includes a touch panel and a display panel. At least one touch line is arranged in the touch panel. At least one data signal line is arranged in the display panel. The touch line and the data signal line extend from the display area to the fan-out area, and a shielding layer is arranged between the touch line and the data signal line in the fan-out area. In areas where the touch line and the data signal line are arranged corresponding to each other in different layers, the shielding layer is formed by the power line. The power line outputs a constant DC voltage signal, and can effectively prevent the data signal line from interfering with the touch line. In areas where the touch line and data signal line are spaced from each other in the same layer, the shielding layer is formed by a power line or an additional isolation line. The isolation line is a separate dummy line with no electric signals, which avoids lateral interference of the data signal line to the touch line. By providing the shielding layer, the present application solves the problem of the data signal line's interference with the touch signals of the touch line, thereby improving the touch performance.

In summary, although the present application has been disclosed as above in preferable embodiments, the above-mentioned preferable embodiments are not intended to limit the present application, and those of ordinary skill in the art can make various changes and modifications without departing from the spirit and scope of the present application. The protection scope of the present application should be defined by the appended claims.

What is claimed is:

1. A touch display screen, comprising a display area and a fan-out area, wherein the fan-out area is arranged at one side of the display area; the fan-out area comprises a bending area, a bonding area, a first area between the bending area and the display area, and a second area between the bending area and the bonding area; and the touch display screen comprises:
 a display panel in which a plurality of data signal lines are arranged; and
 a touch panel in which a plurality of touch lines are arranged;
 wherein the plurality of touch lines and the plurality of data signal lines extend from the display area to the fan-out area; in the first area and the second area, the plurality of touch lines are arranged corresponding to the plurality of data signal lines which are disposed in a different layer from the plurality of touch lines; and a first shielding layer is arranged between the plurality of touch lines and the plurality of data signal lines;
 wherein in the bending area and the bonding area, the plurality of touch lines are disposed in a same layer as the plurality of data signal lines and are spaced apart from the plurality of data signal lines, and a second shielding layer is disposed between the plurality of touch lines and the plurality of data signal lines.

2. The touch display screen according to claim 1, wherein the plurality of touch lines are grouped into a plurality of touch line groups, the plurality of data signal lines are grouped into a plurality of data signal line groups, and the plurality of touch line groups and the plurality of data signal line groups are arranged corresponding to each other in different layers or arranged spaced apart from each other in a same layer.

3. The touch display screen according to claim 1, wherein a power line is disposed in the display panel, and the first shielding layer comprises the power line.

4. The touch display screen according to claim 3, wherein the power line is provided with a first gap corresponding to the bending area, a width of the first gap is greater than a width of the bending area, and the plurality of touch lines and the plurality of data signal lines are routed at the first gap to a layer the same as the power line.

5. The touch display screen according to claim 4, wherein the power line is provided with a second gap corresponding to the bonding area, the second gap extends beyond the bonding area and extends to the second area, and the plurality of touch lines and the plurality of data signal lines are routed at the second gap to the layer the same as the power line.

6. The touch display screen according to claim 5, wherein the second shielding layer comprises the power line.

7. The touch display screen according to claim 5, wherein a plurality of isolation lines are arranged in the bending area and the bonding area, and the plurality of isolation lines are arranged in at least one area each between any two of the power line, one touch line, and one data signal line.

8. The touch display screen according to claim 7, wherein the second shielding layer comprises the power line and the plurality of isolation lines.

9. The touch display screen according to claim 4, wherein the power line is disconnected at a disconnection position close to the bonding area, and the touch line and the data signal line are routed at the disconnection position to the layer the same as the power line and extend to the bonding area, and the plurality of touch lines and the plurality of data signal lines are spaced apart in the bonding area.

10. The touch display screen according to claim 9, wherein the bonding area is further provided with a plurality of isolation lines, and the plurality of isolation lines are arranged between the plurality of touch lines and the plurality of data signal lines.

11. The touch display screen according to claim 10, wherein the second shielding layer of the bonding area comprises the plurality of isolation lines.

12. The touch display screen according to claim 1, wherein a driver chip is bonded to the bonding area, and the plurality of touch lines and the plurality of data signal lines are connected to the driver chip.

13. A touch display device, comprising a touch display screen, the touch display screen comprising a display area and a fan-out area, wherein the fan-out area is arranged at one side of the display area; the fan-out area comprises a bending area and a bonding area, a first area between the bending area and the display area, and a second area between the bending area and the bonding area; and the touch display screen comprises:
   a display panel in which a plurality of data signal lines are disposed; and
   a touch panel in which a plurality of touch lines are arranged;
   wherein the plurality of touch lines and the plurality of data signal lines extend from the display area to the fan-out area; and in the first area and the second area, the plurality of touch lines are arranged corresponding to the plurality of data signal lines in a different layer from the plurality of touch lines, and a first shielding layer is arranged between the plurality of touch lines and the plurality of data signal lines;
   wherein in the bending area and the bonding area, the plurality of touch lines are disposed in a same layer as the plurality of data signal lines and are spaced apart from the plurality of data signal lines, and a second shielding layer is disposed between the plurality of touch lines and the plurality of data signal lines.

14. The touch display device according to claim 13, wherein the plurality of touch lines are grouped into a plurality of touch line groups, the plurality of data signal lines are grouped into a plurality of data signal line groups, and the plurality of touch line groups and the plurality of data signal line groups are arranged corresponding to each other in different layers or arranged spaced apart from each other in a same layer.

15. The touch display screen according to claim 13, wherein a power line is disposed in the display panel, and the first shielding layer comprises the power line.

16. The touch display device according to claim 15, wherein the power line is provided with a first gap corresponding to the bending area, a width of the first gap is greater than a width of the bending area, and the plurality of touch lines and the plurality of data signal lines are routed at the first gap to a layer the same as the power line.

17. The touch display device according to claim 16, wherein the second shielding layer comprises the power line.

18. The touch display screen according to claim 16, wherein a plurality of isolation lines are arranged in the bending area, and the plurality of isolation lines are arranged in at least one area each between any two of the power line, one touch line, and one data signal line.

* * * * *